(12) United States Patent
Rannow et al.

(10) Patent No.: US 7,239,123 B2
(45) Date of Patent: Jul. 3, 2007

(54) MULTIPLEXED DUAL-PURPOSE MAGNETORESISTIVE SENSOR AND METHOD OF MEASURING CURRENT AND TEMPERATURE

(75) Inventors: Randy K. Rannow, Albany, OR (US); Bradley D. Winick, Fort Collins, CO (US); Shaun L. Harris, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 267 days.

(21) Appl. No.: 10/682,344

(22) Filed: Oct. 9, 2003

(65) Prior Publication Data
US 2005/0077890 A1 Apr. 14, 2005

(51) Int. Cl.
G01R 33/09 (2006.01)
G01R 15/20 (2006.01)
G01R 1/44 (2006.01)

(52) U.S. Cl. .................. 324/117 R; 324/105; 324/126

(58) Field of Classification Search ............ 324/117 R, 324/105, 126, 252
See application file for complete search history.

(56) References Cited

U.S. PATENT DOCUMENTS

| | | | | |
|---|---|---|---|---|
| 2,836,791 A | * | 5/1958 | Kaplan | 324/253 |
| 4,448,078 A | * | 5/1984 | Bridges | 73/766 |
| 4,937,521 A | * | 6/1990 | Yoshino et al. | 324/117 R |
| 5,561,366 A | | 10/1996 | Takahashi et al. | |
| 5,585,775 A | | 12/1996 | Ishishita | |
| 5,677,625 A | | 10/1997 | Dieny | |
| 5,708,407 A | | 1/1998 | Mouchot et al. | |
| 6,469,927 B2 | | 10/2002 | Spitzer et al. | |
| 6,490,934 B2 | * | 12/2002 | Garshelis | 73/862.336 |
| 6,667,682 B2 | * | 12/2003 | Wan et al. | 338/32 R |
| 6,781,359 B2 | * | 8/2004 | Stauth et al. | 324/117 H |

OTHER PUBLICATIONS

Jim Daughton and Jerry Granley, "Giant Magnetoresistance Devices Move In," The Industrial Physicist, Jun. 1999, pp. 22-24.
"GMR Switch Precision Digital Sensors", NVE Corporation, Minnesota, Nov. 15, 2002, pp. 1-18.

* cited by examiner

Primary Examiner—Ernest Karlsen

(57) ABSTRACT

The present invention determines temperature and current from resistance measurements of a single magnetoresistive sensor. A dual-purpose sensor includes the magnetoresistive sensor having a single pair of terminals. The sensor is multiplexed under separate current conditions to produce both a temperature measurement and a current measurement in a vicinity of the sensor. A sensor system includes the dual-purpose sensor, a resistance sensing subsystem and a controller that controls the current conditions. A method of measuring temperature and current includes measuring a first resistance of the dual-purpose sensor while a first current is flowing in a conductor adjacent to the sensor, and measuring a second resistance of the sensor while a second current is flowing in the conductor. The first current has a known value while the second current has an unknown value. The temperature and current are determined respectively from the first and second resistance measurements.

22 Claims, 3 Drawing Sheets

MULTIPLEXED DUAL-PURPOSE MAGNETORESISTIVE SENSOR AND METHOD OF MEASURING CURRENT AND TEMPERATURE

TECHNICAL FIELD

The invention relates to electronic devices. In particular, the invention relates to sensors used to monitor operational characteristics of electronic devices.

BACKGROUND

Electronic devices and their constituent components are becoming increasingly complex. With complexity comes an increased need to monitor various performance parameters of such devices and components. In particular, an increase in circuit density often increases a need for monitoring the temperature of the circuit. Power utilization by complex circuits often leads to a need for monitoring electric current flowing to and/or from the circuit as well as within the circuit. This is especially true when considering applications involving power restricted devices, such as those using batteries.

Traditionally, a temperature sensor is employed when the temperature is to be measured. Similarly, when a current is to be measured, a current sensor is employed. Unfortunately such sensors, especially when integrated into a circuit being monitored, tend to occupy valuable circuit real estate. In addition, regardless of whether or not the sensor is integrated into the circuit, the use of a sensor also tends to contribute to the cost of manufacturing. Thus when measuring both temperature and current, using two sensors, one for temperature and one for current, generally consumes twice as much circuit real estate and costs more than would a single sensor.

BRIEF SUMMARY

In some embodiments of the present invention, a dual-purpose sensor is provided. The dual-purpose sensor comprises a magnetoresistive current sensor having a single pair of terminals. The sensor is multiplexed under separate current conditions in a conductor adjacent to the sensor to produce both a temperature measurement and a current measurement in a vicinity of the sensor.

In other embodiments of the present invention, a sensor system that produces a current measurement and a temperature measurement is provided. The sensor system comprises means for sensing current magnetoresistively, means for measuring resistance in the current-sensing means, and means for controlling a current in a conductor adjacent to the current-sensing means.

In yet other embodiments of the present invention, a method of measuring temperature and current is provided. The method comprises measuring a first resistance of a magnetoresistive sensor while a first current is flowing in a conductor adjacent to the sensor. The first current has a known value and the first resistance is measured using a single pair of terminals of the sensor. The method further comprises measuring a second resistance of the magnetoresistive sensor while a second current is flowing in the conductor. The second current has an unknown value, and the second resistance is measured using the single pair of terminals of the sensor. The measured first resistance is used to produce a temperature measurement while the measured second resistance is used to produce a current measurement.

Certain embodiments of the present invention have other features in addition to and in lieu of the features described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

DETAILED DESCRIPTION

The present invention multiplexes a magnetoresistive current sensor to provide dual-purpose sensing in an electronic device or a constituent element thereof. In particular, both a current flowing adjacent to the sensor and a temperature in a vicinity of the sensor may be determined using a single magnetoresistive current sensor of the present invention. Thus, one dual-purpose sensor may be used in place of two or more conventional sensors for such measurements. Additionally, the ability of the sensor to measure temperature may be employed to correct or to allow for an adjustment of the current measurement, thereby improving an accuracy of the current measurement of the dual-purpose sensor.

The dual-purpose sensor according to the present invention may be realized either as a stand-alone sensor or as an integrated sensor. Moreover, the dual-purpose sensor may be employed to measure both temperature and current in one or more of integrated circuits, integrated circuit packages, printed circuit boards, and related circuit elements or components used in electronic devices. For example, several dual-purpose sensors may be integrated into an integrated circuit (IC) to monitor and assist in controlling the power consumption of the IC, according to the invention. In addition, the several integrated dual-purpose sensors may be used to facilitate performance enhancement or optimization of a VLSI device, for example. In another example, an array of dual-purpose sensors may be employed to map current/temperature and/or power utilization of a circuit for design or diagnostic purposes (e.g., detect defects and/or failures), according to the invention.

Figure 1:
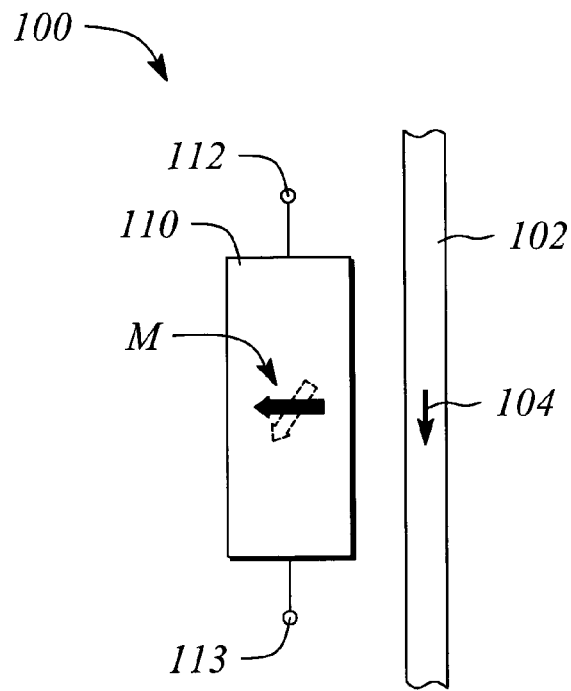
FIG. 1 illustrates a block diagram of an embodiment of a dual-purpose sensor according to an embodiment of the present invention.

FIG. 1 illustrates a block diagram of an embodiment of a dual-purpose sensor 100 according to an embodiment of the present invention. The dual-purpose sensor 100 comprises a magnetoresistive (MR) current sensor 110 having a pair of terminals 112, 113 associated with or extending from the MR current sensor 110. The MR current sensor 110 is multiplexed by controlling a state or condition of a current 104 flowing in a conductor 102 adjacent to the MR current sensor 110. The condition of the current 104 is controlled, such that the current 104 either takes on an a prior known value or an unknown value. When the current 104 having the a prior known value is flowing in the adjacent conductor 102, the dual-purpose sensor 100 produces a temperature measurement. When the current 104 having the unknown value is flowing in the adjacent conductor 102, the dual-purpose sensor 100 produces a current measurement of the current 104. Thus according to the present invention, multiplexing the MR current sensor 110 of the dual-purpose sensor 100 by controlling the current condition enables measurements by the dual-purpose sensor 100 to yield both a temperature measurement in a vicinity of the sensor 100 and a current measurement of an unknown value of the current 104 in the adjacent conductor 102. Moreover, the unknown value of the current 104 may be either constant with time or varying as a function of time during the current measurement.

As already mentioned, both the temperature measurement and the current measurement are produced by measurements taken across the single pair of terminals 112, 113 of the MR current sensor 110. In particular, a first resistance is measured across the pair of terminals 112, 113 and is used to determine the temperature measurement. The first resistance is measured for an a priori known value current condition in the adjacent conductor 102. The a priori known current condition is a particular current flowing in the conductor 102, the value of which is known when the first resistance is measured. Thus, the a priori known current condition may be any particular current 104 such as, but not limited to, zero amperes (0 A), for example. In other words, for an exemplary situation, the first resistance may be measured when the current 104 in the conductor 102 is 'turned OFF' or is set to essentially 0 A. Alternatively, the first resistance may be measured in a current condition when the current 104 is set to another, non-zero value, such as, but not limited to, 1 A, for example.

The temperature measurement is determined from the measured resistance using a known relationship between measured resistance and the temperature for the MR current sensor 110. For example, a 'calibration' curve may be employed. The calibration curve is an empirical relationship between temperature and resistance that is measured or determined for the current sensor 110 during manufacture. The calibration curve may be represented and employed in a variety of forms including, but not limited to, a graphical form, a tabular form (e.g., a look-up table), and a functional form.

For example, a series of resistances across the terminals 112, 113 of the MR current sensor 110 may be measured at each of a set of discrete temperatures spanning an operating temperature range of the MR current sensor 110. The resistance/temperature pairs thus created may be stored in a look-up table or plotted as a graph with temperature associated with a first axis and resistance associated with a second axis. Techniques including, but not limited to, interpolation and 'best-fit' curve fitting may be employed to determine the resistance/temperature relationship between measured pairs. Preferably, the calibration curve resistance/temperature measurements are performed under the a priori known current condition in the adjacent conductor 102 mentioned hereinabove.

The resulting calibration curve relates or maps resistance under the a priori known current condition of the current sensor 110 to temperature across the operating temperature range. Thus from a measured resistance, a corresponding temperature may be determined using the calibration curve. In another example, a known thermal coefficient of resistance (TCR) may be employed to determine a change in resistance as a function of temperature. Using the TCR, a temperature may be computed from a resistance measured for the current sensor 110 and a baseline resistance measured for the current sensor 110 at a baseline temperature. Using TCR to determine the temperature from the current sensor 110 measurement also assumes that the a priori known current condition is maintained in the adjacent conductor 102 during the resistance measurement and the baseline resistance measurement.

Having determined temperature using the first measured resistance, a second resistance measured across the terminal pair 112, 113 is used to determine a current measurement. The second resistance is measured when an unknown current 104 to be determined is flowing in the conductor 102. A relationship between resistance and a magnetic field produced by the current 104 flowing in the adjacent conductor 102 is employed to compute the current measurement. As with temperature, a calibration curve relating the flowing current 104 to a measured resistance may be determined empirically, the calibration curve serving as the relationship. Alternatively, the relationship may be determined analytically, for example, employing a measured baseline resistance determined during manufacture.

Advantageously, a family or a set of relationships between resistance or change in resistance and current 104 may be employed. In particular, individual member relationships of the set may differ as a function of current sensor-determined temperature. Using the temperature determined for the a priori known current 104, a value of the unknown current 104 may be corrected for the determined temperature by selecting an appropriate member relationship based on the determined temperature. As above, interpolation, curve fitting and related techniques may be used in between member relationships (e.g., to calculate current values from resistances that are not explicitly included in the calibration data).

The magnetoresistive (MR) current sensor 110 comprises a magnetic field sensor made of a magnetoresistive material. A magnetoresistive material is a material having a resistivity that varies according to a strength and/or direction of an applied magnetic field. Thus, the magnetic field sensor (or hereinafter 'MR sensor') exhibits a resistance that varies as a function of the applied magnetic field. When employed as the MR current sensor 110, the MR sensor senses or responds to a magnetic field produced by a current flowing in a conductor adjacent to the MR sensor. Typically, the MR sensor measures the current in terms of a change in the sensor resistance compared to a baseline resistance. The current measurement may be determined analytically and/or may be determined empirically using a calibration of the MR sensor. As such, the MR current sensor 110 of the present invention generally is an MR sensor that measures the current 104 flowing in the adjacent conductor 102 in terms of a change in a resistance measured between a first terminal 112 and a second terminal 113 of the pair of terminals 112, 113.

Virtually any magnetoresistive (MR) sensor may be employed as the MR current sensor 110 of the invention. In particular, a first class of MR sensors known as 'anisotropic magnetoresistive (AMR)' sensors and/or a second class of MR sensors known as 'giant magnetoresistive (GMR)' sensors may be used as the MR current sensor 110 according to the present invention, for example.

An AMR sensor typically comprises a thin film of magnetoresistive material deposited on a substrate to connect between the first and second terminals. For example, a ferro-material such as, but not limited to, nickel-iron (Ni—Fe or permalloy), may be deposited as a thin film on a silicon wafer or another substrate material used in integrated circuit (IC) manufacture. The thin film of the MR material is then patterned into a resistive strip or strips that connect the first terminal to the second terminal. In addition, typically a strong magnetic field is applied to set or establish an 'easy axis' or preferred orientation of a magnetization (M) vector of the MR material during manufacture.

A resistance of the AMR sensor measured between the first and second terminals varies as a function of an angular difference $\theta$ between the M vector and a direction of a sensing current flowing through the sensor. The sensing current is a current in the AMR sensor that is employed to measure the resistance. In general, a maximum resistance is produced when the sensing current flows in a direction parallel to the M vector while a minimum resistance is produced when the sensing current flow is essentially perpendicular to the M vector.

When an external magnetic field is applied to the AMR sensor, the M vector of the MR material may rotate resulting in a change in the angular difference $\theta$. The change in the angular difference $\theta$ produced by the M vector rotation results in a change in the resistance of the AMR sensor. In FIG. 1, a solid arrow indicates an exemplary easy-axis M vector. An exemplary rotated M vector produced by the action of the external magnetic field is illustrated as a dashed-line arrow in FIG. 1. Thus, the resistance of the AMR sensor changes in response to the application of the external magnetic field.

The change in resistance due to the effect of the external magnetic field is known to those skilled in the art as a 'magnetoresistive effect'. Further background information concerning AMR sensors and the manufacture and use thereof for sensing current may be found in "A New Perspective on Magnetic Field Sensing", by Michael J. Caruso et al., Honeywell, Inc., 5/98, pp. 1-19, and in *Thin Film Magnetoresistive Sensors*, by S. Tumanski, Inst. of Physics Publishing Ltd., Bristol and Philadelphia, 2001, pp. 1-163, both of which are incorporated by reference herein.

When the AMR sensor is employed as a current sensor, generally a current flowing in a conductor adjacent to the AMR sensor produces the external magnetic field. Maxwell's Equations uniquely define a unique relationship between the current flowing in a conductor and the magnetic field that is produced by the flowing current. As such, a measure of the current flowing in the conductor may be computed or otherwise determined from the magnetic field measured by the AMR sensor. Lienhard et al., U.S. Pat. No. 4,385,273; Milkovic, U.S. Pat. No. 4,414,510; Yoshino et al., U.S. Pat. No. 4,937,521; and Sokolich et al., U.S. Pat. No. 5,502,325, all four of which are incorporated herein by reference, each disclose various exemplary MR and/or AMR current sensors that may be employed as the MR current sensor 110 according to the present invention.

A GMR sensor is an MR sensor that employs a so-called "giant magnetoresistive" effect to measure an applied magnetic field. Albert Fert in France and separately, Peter Grunberg in Germany, and their respective co-workers discovered the giant magnetoresistive effect independently around 1988. A GMR sensor comprises a stacked or layered set of alternating thin film magnetic materials and non-magnetic materials. For example, a stack of alternating thin film layers of copper (Cu) and Ni—Fe (permalloy) may be used to produce a GMR sensor. The set of alternating thin film layers produces the giant magnetoresistive effect and thus greatly enhances a sensitivity of a change in resistance of the GMR sensor to the applied magnetic field when compared to an AMR sensor. Moreover, as with the AMR sensors described hereinabove, GMR sensors may be employed as current sensors by locating the GMR sensor adjacent to a conductor carrying a current to be sensed or determined and measuring the resistance of the GMR sensor. The measured resistance is, in turn, used to determine the magnetic field produced by the current. Then, a current measurement is computed or otherwise determined from the determined magnetic field.

Various configurations of GMR sensors applicable to the MR current sensor 110 of the invention include, but are not limited to, current in plane (CIP) and current perpendicular to plane (CPP) configurations. In addition, various types of GMR sensors may be employed as the MR current sensor 110 according to the present invention including, but not limited to, unpinned sandwich GMR sensors, antiferromagnetic multilayer GMR sensors, spin valve GMR sensors, and GMR sensors that employ spin dependent tunneling (SDT). A variety of such GMR sensor types and the operation thereof are described by Michael J. Caruso et al., cited supra, and by S Tumanski, supra, pp. 165-324, both incorporated by reference herein. Additionally, various applicable GMR current sensors and fabrication thereof are disclosed by Dieny et al., U.S. Pat. No. 5,206,590; Stearns et al., U.S. Pat. No. 6,002,553; Lenssen, U.S. Pat. No. 6,215,301 B1; Gill, U.S. Pat. No. 6,473,275; Daughton et al., U.S. Pat. No. 6,429,640 B1; and also by Wan et al., U.S. Pat. App. Publ., 2003/0117254 A1, all of which are incorporated by reference herein.

Figure 2:
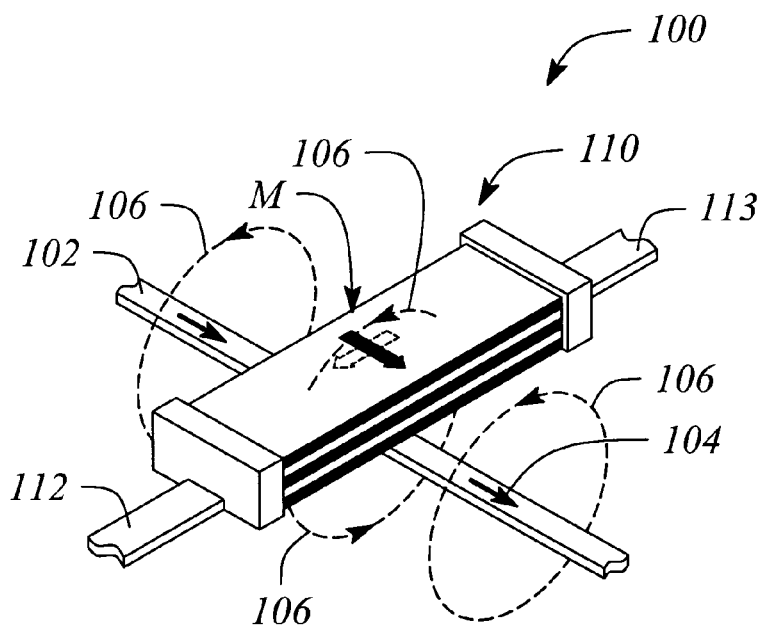
FIG. 2 illustrates a perspective view of an exemplary embodiment of the dual-purpose sensor illustrated in FIG. 1.

FIG. 2 illustrates a perspective view of an exemplary embodiment of the dual-purpose sensor 100 illustrated in FIG. 1. The exemplary dual-purpose sensor 100 employs a GMR type sensor as the MR current sensor 110 having a CIP configuration. As illustrated, an M vector of the GMR current sensor 110 rotates in response to a magnetic field 106 generated by the current 104 flowing in the adjacent conductor 102. Rotation of the M vector changes the resistance of the exemplary GMR current sensor 110 measured between the terminals 112, 113. The change in resistance is proportional to the current 104, or more precisely, a magnetic field that is produced by and proportional- to the current 104 flowing in the adjacent conductor 102.

Prior to using the exemplary dual-purpose sensor 100 illustrated in FIG. 2, a set of calibration curves is generated. In particular, the exemplary GMR current sensor 110 may be exposed to a set of known temperatures while a zero ampere current 104 is flowing in the adjacent conductor 102. At each temperature in the set, a resistance of the GMR current sensor 110 is measured. The measured resistances are plotted against temperature to generate a temperature calibration (TC) curve. Then, the GMR current sensor 110 is exposed to a first known temperature and a set of known currents 104 are applied to the adjacent conductor 102. For each current of the set, a resistance of the GMR current sensor 110 is measured. The measured resistances are plotted against current to generate a first current calibration (CC) curve corresponding to the first temperature. The exemplary GMR current sensor 110 is exposed to a second known temperature and a second CC curve corresponding to the second temperature is generated in an analogous manner. The current calibration process is repeated until a set of CC curves is generated that covers or spans a temperature range of interest. At this point, the exemplary dual-purpose sensor 100 is said to be 'calibrated'.

Having been calibrated, the exemplary dual-purpose sensor 100 illustrated in FIG. 2 may be employed to measure or determine an otherwise unknown temperature in the vicinity of and an otherwise unknown current flowing in the adjacent conductor 102. For example, the unknown current may be a current flowing into or out of a portion of a very large scale integration (VLSI) circuit. Moreover, the exemplary dual-purpose sensor 100 may be integrated into the VLSI circuit and manufactured along with other portions of the VLSI circuit.

To measure or determine current and temperature following manufacture, the current 104 in the adjacent conductor 102 is turned OFF and a resistance of the exemplary GMR current sensor 110 is measured. The TC curve is used to convert the measured resistance into a temperature measurement. Then, the current 104 in the adjacent conductor 102 is turned ON and resistance of the GMR current sensor 110 is measured again. Using the previously determined temperature measurement, a corresponding CC curve is selected. With the selected CC curve, the measured resistance is converted into a current measurement. The temperature measurement and/or current measurement using the dual-purpose sensor 100 may be repeated as often as is desired, according to any specific monitoring situation. For example, the temperature may be determined approximately every minute while the current may be determined at 1-second intervals.

Advantageously, the current measurement thus produced is essentially a temperature-corrected current measurement. Furthermore, as mentioned hereinabove, interpolation or another similar technique may be employed to produce temperature and/or current measurements that are not found in a particular TC curve or CC curve.

Figure 3:
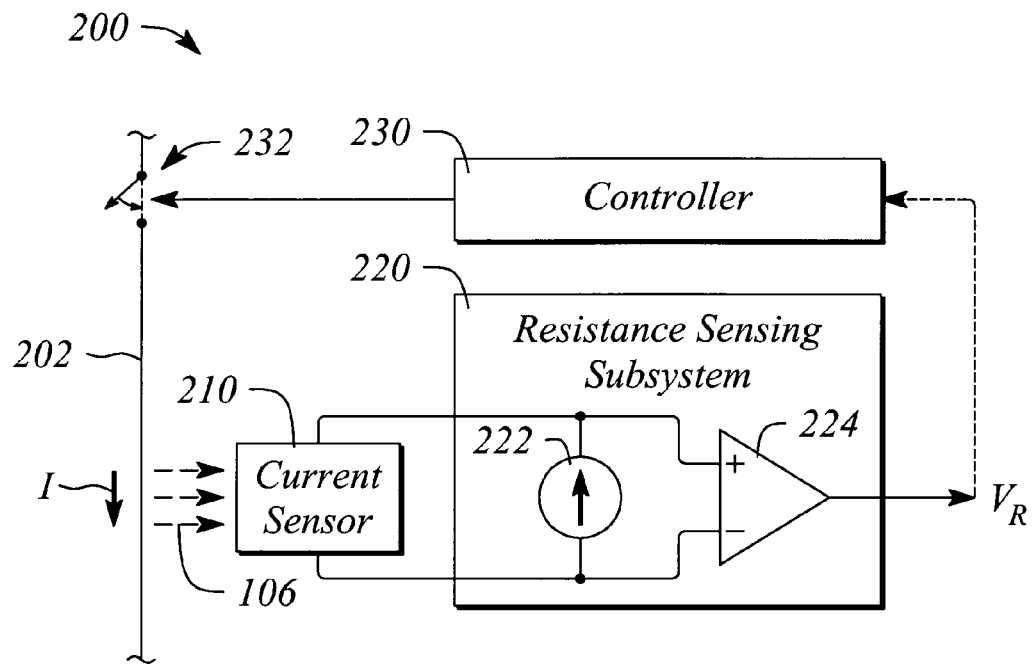
FIG. 3 illustrates a block diagram of an embodiment of a sensor system according to an embodiment of the present invention.

FIG. 3 illustrates an embodiment of a sensor system 200 according to an embodiment of the present invention. The sensor system 200 comprises means for sensing current in an adjacent current-carrying conductor 202, the means employing a magnetoresistive (MR) effect. The sensor system 200 further comprises means for measuring or sensing a resistance of the current sensing means. The sensor system 200 further comprises means for controlling a current in the adjacent conductor 202. Specifically, the controlling means sets the current in the conductor 202 to a known value during a first or temperature-measuring phase of operation and allows the current to assume an unknown value during a second or current-measuring phase of operation. The unknown current value is measured by the sensor system 200 during the current-measuring phase while a temperature of the sensor system 200 is measured during the temperature-measuring phase.

In particular as illustrated in FIG. 3, the sensor system 200 comprises a magnetoresistive (MR) current sensor 210 adjacent to the conductor 202, a resistance-sensing subsystem 220, and a controller 230. The resistance-sensing subsystem 220 is connected to a pair of terminals of the MR current sensor 210 and produces measurements of a resistance across the terminals. The controller 230 controls a current flowing in the conductor 202 during the temperature-measuring and current-measuring phases. The controller 230 also may be connected to receive and process the resistance measurements produced by the resistance sensing subsystem 220.

The MR current sensor 210 is essentially similar to the dual-purpose sensor 100, in particular the MR current sensor 110 described hereinabove with respect to the dual-purpose sensor 100. The MR sensor 210 may be any MR sensor magnetically coupled to a magnetic field produced by the current-carrying conductor 202. Thus, the MR current sensor 210 may be an AMR current sensor and/or a GMR current sensor, for example. Moreover, the MR current sensor 210 may be a sensor integrated into a circuit or a circuit package with the conductor 202 as an element of the circuit or package. Alternatively, the MR current sensor 210 may be a discrete sensor applied to the circuit or the circuit package. As used herein, an 'integrated' sensor is a sensor fabricated as part of the circuit while a 'discrete' sensor is generally fabricated separately and later assembled into the circuit.

The resistance-sensing subsystem 220 may be any subsystem capable of sensing and measuring a resistance or a change in resistance of the MR current sensor 210. For example as illustrated in FIG. 3, the resistance-sensing subsystem 220 may comprise a constant current source 222 and a sense amplifier 224. The constant current source 222 is connected to the MR current sensor 210 between the pair of terminals and supplies an essentially constant current to the MR current sensor 210. Likewise, the sense amplifier 224 is connected to the MR current sensor 210 at the pair of terminals. The sense amplifier 224 measures a voltage across the MR current sensor 210, resulting from the constant current supplied thereto. The sense amplifier 224 may produce an output, such as but not limited to, a voltage $V_R$, which is proportional to the measured resistance. Alternatively, the sense amplifier 224 may convert the measured voltage into a digital representation of the measured resistance. The measured voltage is converted into a resistance using a known value of the constant current from the source 222 and Ohm's law. One skilled in the art is familiar with many approaches and circuits used to realize such a resistance sensing subsystem, all of which are within the scope of the present invention.

The controller 230 may be any controller that is capable of facilitating control of the current in the conductor 202 during the temperature-measuring and current-measuring phases. In particular, the controller 230 sets the current to a known value or condition (e.g., ~0 A) during the temperature-measuring phase and allows an unknown current value or condition to flow in the conductor 202 during the current-measuring phase.

For example, the controller 230 may be a microprocessor that controls current flowing to a portion of a circuit, component, or subsystem such as, but not limited to, a multifunctional VLSI circuit. Alternatively, the microprocessor may control current flowing to a portion or portions of the microprocessor itself for power conservation reasons, for example. In another example, the controller 230 may be a communications driver circuit that generates a binary data sequence on the conductor 202. If the binary data sequence comprises two states, a first state being an 'OFF' current condition and the second state being an 'ON' current condition, then the communications driver circuit can be viewed as the controller 230 that switches the conductor current between the known and unknown conditions as described hereinabove. In particular, during the 'OFF' current condition, the sensor system 200 may measure the temperature while during the 'ON' condition the sensor system 200 may measure the unknown current flowing in the conductor 202. A variety of other controllers and subsystems such as power supply controllers and battery charging subsystems may likewise be employed as the controller 230, according to the present invention.

Thus, through the cooperative action of the controller 230, the resistance-sensing subsystem 220, and the MR current sensor 210, both the temperature and the current are measured or determined. Specifically, the temperature and current are determined by the sensor system 200 in a manner essentially similar to that described hereinabove for the dual-purpose sensor 100.

As illustrated in FIG. 3, a switch 232 is controlled by the controller 230 to set the current in the conductor 202. The switch 232 is illustrated in FIG. 3 by way of example and is not intended to limit the scope of the present invention. Functioning of the switch 232 is described further below with respect to FIG. 4 also.

Figure 4:
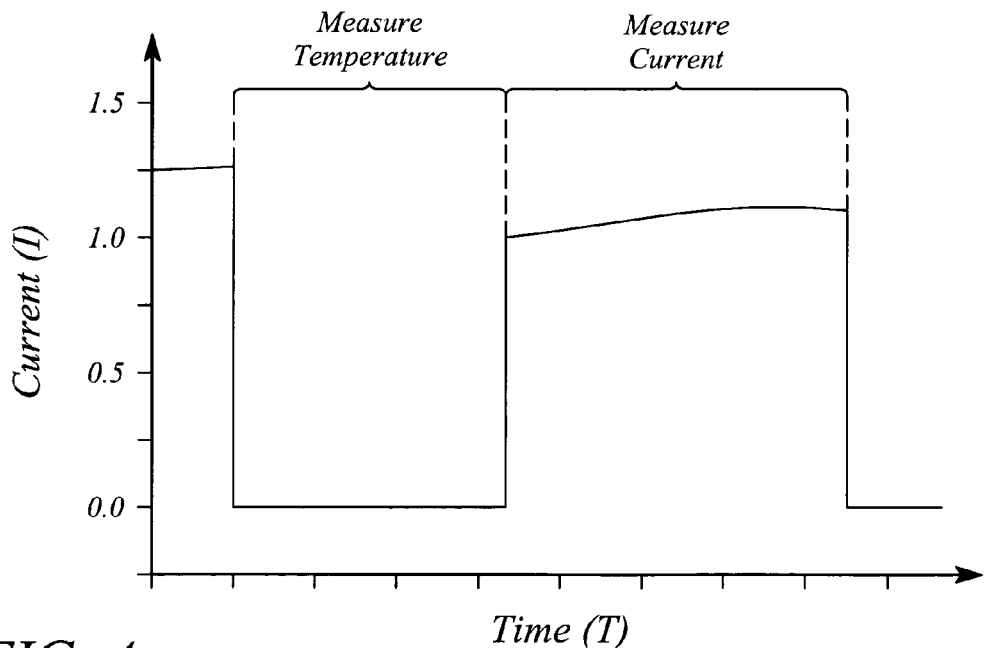
FIG. 4 illustrates a graph in which an exemplary current flowing in a conductor magnetically coupled to the sensor system illustrated in FIG. 3 is plotted as a function of time.

FIG. 4 illustrates a graph in which an exemplary current I flowing in a conductor 202 is plotted as a function of time T. The conductor 202 is magnetically coupled to the current sensor 210 of the sensor system 200 illustrated in FIG. 3. During a first portion of time, the current I is set to 0 A by the controller 230. For example, the controller 230 may deactivate or 'open' the switch 232 to set the current to 0 A.

In the first portion of time T, the sensor system 200 measures the resistance of the current sensor 210. The resistance measured by the sensor system 200 during the first time portion is proportional to a temperature in the vicinity of the current sensor 210. As such, the first portion of time T is labeled 'Measure Temperature' in FIG. 4.

The measured resistance is converted into a temperature measurement. For example, a temperature calibration curve for the MR current sensor 210 may be employed to convert the measured resistance into a temperature measurement. One or more resistance measurements may be made within the first time period and converted into temperature measurements. Thus, several temperature measurements may be averaged to improve an accuracy of the temperature measurement.

In some embodiments, the measured resistance may be communicated to the controller 230 as indicated by the dashed line in FIG. 3 from the resistance sensing subsystem 220. The controller 230 may execute a computer program that accesses the temperature calibration curve stored in memory and converts the measured resistance into the temperature measurement.

Referring again to FIG. 4, during a second portion of time T, the current I is allowed to assume the unknown value by the controller 230. For example, the controller 230 may activate the switch 232 thereby allowing the current I to flow in the conductor 202. The second portion of time is labeled 'Measure Current' in FIG. 4. In the second portion of time T, the sensor system 200 measures the resistance of the current sensor 210. The measured resistance during the second time portion T is proportional to the unknown value of the current flowing in the conductor 202. The measured resistance is converted into a current measurement of the unknown current value.

In a manner similar to that used in conjunction with the temperature measurement, a current calibration curve for the MR current sensor 210 may be employed to convert the measured resistance into a current measurement, for example. One or more resistance measurements may be made within the second time portion and converted into current measurements. Thus, several current measurements may be averaged to improve an accuracy of the current measurement. Alternatively or in addition, several current measurements taken during the second time portion may be employed to track or determine a time-varying current.

Again, in some embodiments, the measured resistance may be communicated to the controller 230, as indicated by the dashed line in FIG. 3 from the resistance sensing subsystem 220. The computer program of the controller 230 may further access the current calibration curve stored by the controller 230 and compute the current measurement from the communicated measured resistance taken during the current measurement or the second time portion.

Figure 5:
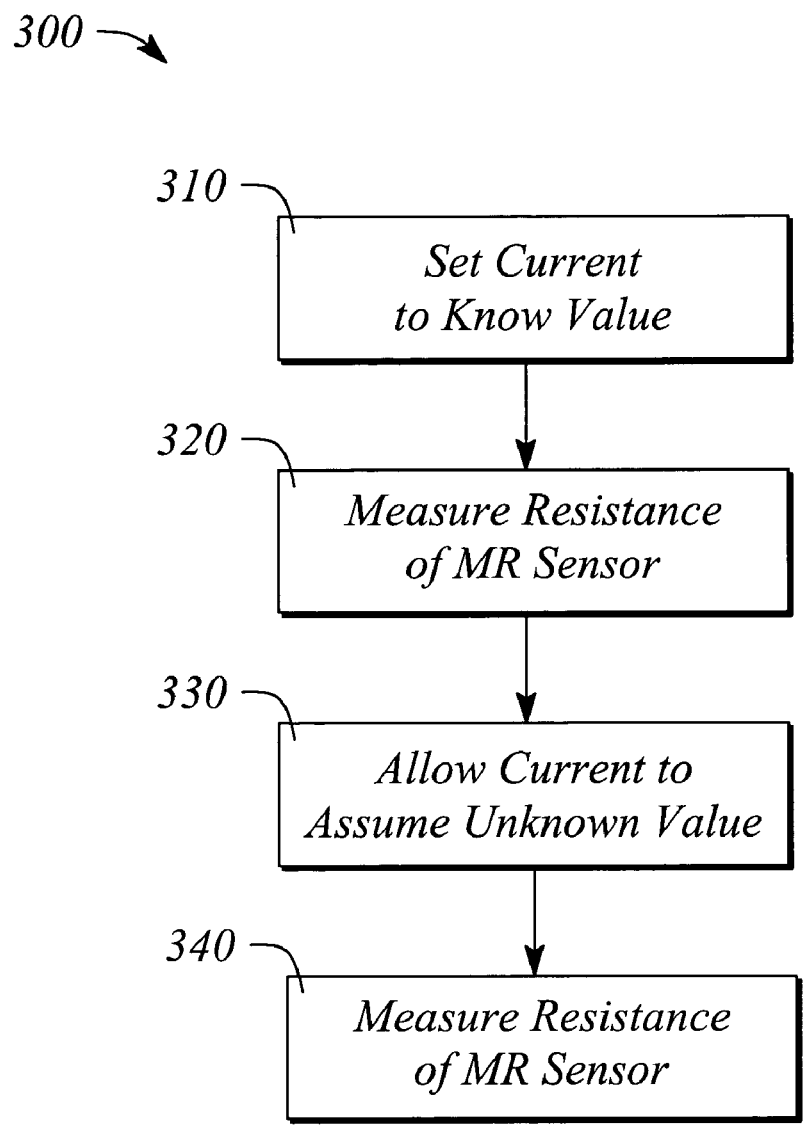
FIG. 5 illustrates a flow chart of an embodiment of a method of measuring a current and a temperature using a magnetoresistive sensor according to an embodiment of the present invention.

FIG. 5 illustrates an embodiment of a method 300 of measuring a current and a temperature using a magnetoresistive (MR) sensor according to an embodiment of the present invention. In particular, the method 300 of measuring can produce both the current measurement and the temperature measurement from a single MR sensor. Moreover, the method 300 employs a single MR sensor having a single pair of terminals for determining current and temperature measurements in the vicinity of the MR sensor. The measured current is a current flowing in a conductor adjacent to the MR sensor. Specifically, the adjacent conductor is magnetically coupled to the MR sensor. The measured temperature is a temperature of or in the vicinity of the MR sensor.

The method 300 of measuring comprises setting 310 a current in the adjacent conductor to a known value or condition. For example, the current may be set to essentially zero 0 A as the known value.

The method 300 of measuring further comprises measuring 320 a resistance of the MR sensor to establish a baseline resistance measurement. Since the current flowing in the conductor has a known value, variations in the measured 310 resistance are a function of a thermal coefficient of resistance (TCR) of the MR sensor. Thus, the TCR or an empirical representation thereof (e.g., temperature calibration curve) relates the measured 320 resistance to the temperature of the MR sensor.

The method 300 further comprises allowing 330 the current to assume an unknown value or condition. The unknown value is the current value to be determined or measured according to the method 300. For example, the unknown value may be the current consumed by or supplied to a portion of a system or subsystem being monitored by the method 300. The monitoring may be used to determine an operational condition of the system or subsystem or to control an overall power utilization by the system or subsystem, for example.

The method 300 further comprises measuring 340 a resistance of the MR sensor while the current is allowed 330 to assume the unknown value. Since the measured 340 resistance of the MR sensor is proportional to the current flowing in the adjacent conductor, the measured 340 resistance determines the unknown current value.

Thus, there have been described a dual-purpose current sensor 100 and a sensor system 200 that employ multiplexing a single MR sensor to measure both temperature and current. In addition, a method of measuring temperature and current using an MR sensor has been described. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A dual-purpose sensor comprising:
   a magnetoresistive current sensor having a single pair of terminals;
   a conductor adjacent to the magnetoresistive current sensor;

a first current flowing in the conductor during a first time period, the first current having a value that is a priori known; and a second current flowing in the conductor during a second time period, the second time period being different from the first time period, wherein the dual-purpose sensor produces a temperature measurement in a vicinity of the sensor during the first time period and a current measurement of the second current during the second time period using the single pair of terminals.

2. The dual-purpose sensor of claim 1, wherein the a priori known value of the first current is constant during the first time period.

3. The dual-purpose sensor of claim 1, wherein the a priori known value of the first current is essentially zero amperes.

4. The dual-purpose sensor of claim 1, wherein the magnetoresistive current sensor comprises a first resistance during the first time period, the first resistance being measured across the single pair of terminals to produce the temperature measurement.

5. The dual-purpose sensor of claim 1, wherein the magnetoresistive current sensor comprises a second resistance during the second time period, the second resistance being measured across the single pair of terminals to produce the current measurement of the second current in the conductor.

6. A dual-purpose sensor comprising:

a magnetoresistive current sensor having a single pair of terminals;

a first current flowing adjacent to the magnetoresistive current sensor during a first time period; and a second current flowing adjacent to the magnetoresistive current sensor during a second time period, the first time period being different from the second time period, wherein both a temperature measurement in a vicinity of the magnetoresistive current sensor and a current measurement of one of the first current and the second current are produced from separate resistance measurements made across the single pair of terminals, the separate resistance measurements being made during each of the first time period and the second time period.

7. The dual-purpose sensor of claim 6, wherein the separate resistance measurements comprise a first resistance measured across the single pair of terminals during the first time period, the first current being an a priori known current, and a second resistance measured across the single pair of terminals during the second time period, the second current having an unknown value.

8. The dual-purpose sensor of claim 7, wherein the measured first resistance is used to produce the temperature measurement, the measured second resistance being used to produce the current measurement.

9. The dual-purpose sensor of claim 7, wherein the a priori known current is essentially zero amperes.

10. The dual-purpose sensor of claim 6, wherein the magnetoresistive sensor is a giant magnetoresistive sensor.

11. The dual-purpose sensor of claim 6, wherein the magnetoresistive sensor is an anisotropic magnetoresistive sensor.

12. A dual-purpose sensor comprising:

means for sensing current comprising a single pair of terminals and a resistivity, the resistivity being proportional to an adjacent current and a temperature;

a first current during a first time period adjacent to the means for sensing current, the first current having a value that is a priori known; and a second current during a second time period adjacent to the means for sensing current, the second current having an unknown value, wherein the dual-purpose sensor produces both a measurement of the temperature during the first time period and a measurement of the unknown value of the second current during the second time period, both measurements being provided using the single pair of terminals and the resistivity.

13. The dual-purpose sensor of claim 12, wherein the means for sensing current comprises a giant magnetoresistive sensor.

14. The dual-purpose sensor of claim 12, wherein a resistance measurement of the resistivity during the first time period and the a priori known value of the first current facilitate producing the temperature measurement.

15. The dual-purpose sensor of claim 14, wherein a resistance measurement of the resistivity during the second time period and the temperature measurement facilitate producing the current measurement.

16. The dual-purpose sensor of claim 12, wherein the a priori known value of the first current is a constant value equal to zero amperes.

17. A dual-purpose sensor comprising:

a first output during a first time period, the first output representing a temperature measurement in a vicinity of the dual-purpose sensor;

a second output during a second time period, the second output representing a current measurement;

a magnetoresistive current sensor having a single pair of terminals; and a current adjacent to the magnetoresistive current sensor, the current having an a priori known value during the first time period and an unknown value during the second time period, wherein both the first output and the second output are associated with the single pair of terminals, the first output employing the a priori known value of the adjacent current to represent the temperature measurement and the second output employing the temperature measurement to represent the current measurement, the current measurement determining a value of the adjacent current during the second time period.

18. The dual-purpose sensor of claim 17, wherein the a priori known value of the first current is constant during the first time period.

19. The dual-purpose sensor of claim 17, wherein the first output is proportional to a resistance between a first terminal and a second terminal of the single pair of terminals during the first time period.

20. The dual-purpose sensor of claim 17, wherein the second output is proportional to a temperature in a vicinity of the dual-purpose sensor and to a resistance between a first terminal and a second terminal of the single pair of terminals during the second time period.

21. The dual-purpose sensor of claim 17, wherein the magnetoresistive current sensor comprises a giant magnetoresistor (GMR).

22. A dual-purpose sensor comprising:

a magnetoresistive current sensor having a single pair of terminals; and a current adjacent to the magnetoresistive current sensor, the current having an a priori known value during a first time period and an unknown value during a second time period, wherein the magnetoresistive current sensor comprises a first resistivity during the first time period and a second resistivity during the second time period, the first resistivity being proportional a temperature in a vicinity of the magnetoresistive current sensor and the a priori known value of the adjacent current, the second resistivity being proportional to the temperature and the unknown value of the current during the second time period.

* * * * *

UNITED STATES PATENT AND TRADEMARK OFFICE
CERTIFICATE OF CORRECTION

PATENT NO. : 7,239,123 B2 Page 1 of 1
APPLICATION NO. : 10/682344
DATED : July 3, 2007
INVENTOR(S) : Randy K. Rannow et al.

It is certified that error appears in the above-identified patent and that said Letters Patent is hereby corrected as shown below:

In column 13, line 8, in Claim 22, after "proportional" insert -- to --.

Signed and Sealed this

Twelfth Day of August, 2008

JON W. DUDAS
*Director of the United States Patent and Trademark Office*